Oct. 3, 1961 L. R. HARPER 3,003,070

TRANSISTOR SWITCHING CIRCUITS INCLUDING AN INVERTER STAGE DRIVING AN EMITTER-FOLLOWER STAGE

Filed Dec. 31, 1957 2 Sheets-Sheet 1

INVENTOR.
L. R. HARPER

BY

ATTORNEY

*INVENTOR.*
L. R. HARPER
*BY* Lester H. Clark
ATTORNEY

United States Patent Office 3,003,070
Patented Oct. 3, 1961

3,003,070

TRANSISTOR SWITCHING CIRCUITS INCLUDING AN INVERTER STAGE DRIVING AN EMITTER-FOLLOWER STAGE

Leonard Roy Harper, Poughkeepsie, N.Y., assignor to International Business Machines Corporation, New York, N.Y., a corporation of New York Filed Dec. 31, 1957, Ser. No. 706,486
5 Claims. (Cl. 307—88.5)

This invention relates to transistor circuits, and particularly to circuits for handling so-called "large" signals, i.e., signals which utilize square waves or otherwise shift between separated values.

Such circuits find employment in high-speed computers. In such computers, it is desirable to have a circuit respond quickly to an input signal. That response is measured by the switching time, which may be considered in two phases, commonly termed the turn-on and turn-off times of the transistor circuit. A finite interval is required to shift a transistor from a low output current or Off state to a high output current or On state. This interval is known as the turn-on time. Similarly, another finite interval of time is required to shift the transistor from its high output current state to its low output current state, and is known as the turn-off time.

In the large signal circuits of the prior art, the transistors are commonly dynamically driven by an active potential signal during the turn-on time, while during the turn-off time the circuit is relatively passive, so that the fall time is determined by the impedance in the circuit rather than by the characteristics of the input signal.

In those prior art circuits, the turn-on time may be reduced by controlling the voltage and current of the driving impulse. The turn-off time is usually somewhat longer and depends on the characteristics of the individual transistors and impedances.

An object of the present invention is to provide a switching circuit the output of which is dynamically driven during both its turn-on and turn-off times, so as to cut down the overall switching time to a minimum.

Another object of this invention is to provide, in a switching circuit of the type described, a maximum output voltage for a given value of supply voltage.

Another object of the invention is to provide an improved inverter circuit of the type described.

Another object is to provide improved trigger circuits of the type described.

Another object is to provide improved circuits of the type described which operate in response to minimum current input signals and which have high current gain.

The foregoing and other objects of the invention are attained in the circuits described herein. The essential unit of all these circuits is a combined inverter and emitter-follower stage, comprising two transistors, one connected as an inverter and the other as an emitter-follower. The input signal is coupled to the base of the inverter. The collector of that transistor is directly conductively coupled to the base of the emitter-follower transistor. When the inverter is On, it produces an output signal which holds the emitter follower Off. The load circuit of the inverter is connected to a substantially higher voltage source than is conventional. This voltage source is made high enough so that when the emitter-follower transistor is On, the current flow through it is more than sufficient to saturate it, and is effective to store minority current carriers therein. The stored minority carriers in the emitter-follower are effective when the latter is turned Off to provide a transient low impedance between the emitter and base, which allows its output circuit to turn Off quickly.

The collector of the emitter-follower transistor is connected to a battery. When the emitter-follower is On, this battery acts through the collector-base impedance of the emitter-follower transistor to clamp the potential of the collector of the inverter transistor.

According to a modification of the invention two of the basic units described above are cross-coupled to provide a trigger circuit.

According to another modification of the invention, one of the basic units may be modified by the addition of a second inverter, cascaded with the first inverter. A binary signal input is provided with a gating system which alternately directs incoming signals to the first inverter or the second inverter.

Other objects and advantages of the invention will become apparent from a consideration of the following specification and claims taken together with the accompanying drawings.

FIG. 1

Figure 1:
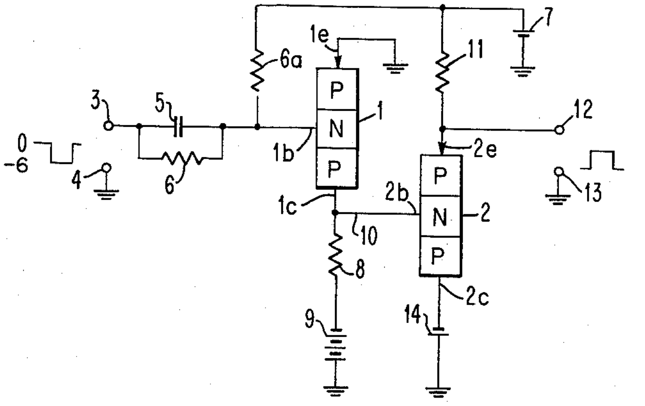
FIG. 1 is a wiring diagram of an emitter-follower inverter circuit embodying the invention.

The circuit of this figure includes a transistor 1 connected as an inverter, and a transistor 2 connected as an emitter-follower. The transistor 1 has an emitter electrode 1*e*, a base electrode 1*b* and a collector electrode 1*c*. The transistor 2 has an emitter electrode 2*e*, a base electrode 2*b* and collector electrode 2*c*. Input signals are received at input terminals 3 and 4. Input terminal 4 is connected to ground. Input terminal 3 is connected through a capacitor 5 and a parallel resistor 6 to the base electrode 1*b*. Base electrode 1*b* is connected through a resistor 6*a* and a biasing battery 7 to ground. Emitter electrode 1*e* is connected directly to ground. Collector electrode 1*c* is connected through a load resistor 8 and a load supply battery 9 to ground. Collector 1*c* is also connected directly through a wire 10 to the base 2*b* of transistor 2. Emitter electrode 2*e* is connected through a resistor 11 and the battery 7 to ground. Emitter electrode 2*e* is also connected to an output terminal 12. Another output terminal 13 is connected to ground. Collector electrode 2*c* is connected to ground through a battery 14 of lower potential than battery 9.

*Operation of FIG. 1*

When the input signal is On (zero volts) across terminals 3 and 4, the inverter transistor is held Off by the biasing battery 7. The collector 1*c* tends to swing toward the potential of the battery 9, which in the example illustrated is highly negative (—51 volts). However, the battery 14 and the base collector impedance of transistor 2 cooperate to clamp the potential of the collector 1*c* at a value slightly more negative than the potential of battery 14. The emitter-base impedance of the emitter-follower transistor 2 is thereby strongly forwardly biased and a substantial current flows through resistor 11, the emitter-base impedance of transistor 2, and resistor 8. The impedance of resistor 8 is chosen so that this current flow is in excess of that necessary to saturate the transistor 2, and less than that flowing through resistor 11. This relationship between the currents through resistor 8 and 11 insures that only part of the current flowing through the emitter 2*e* flows through base 2*b*, while the other part flows through the collector maintaining a normal reverse bias of the base-collector impedance. The excessive current also causes the storage of minority carriers, in this case holes, in the N-region of the transistor 2. The output terminal 12 is now at its most negative value, due to the high potential drop across resistor 11, and the low potential drop between emitter 2*e* and collector 2*c*. Terminal 12 is now very near the potential of the ungrounded terminal of battery 14.

When the input signal switches from its On value of zero volts to its Off value near —6 volts, the inverter transistor 1 is turned On. The current flow through resistor 8 increases due to the flow through transistor 1, and the collector 1*c* swings to a more positive potential, raising the potential of base 2*b* and cutting the emitter-follower transistor 2 Off. Due to the hole storage in the transistor 2, there is a momentary low impedance in the normally high impedance direction between the base 2*b* and emitter 2*e*, so that the positive-going change in potential at base 2*b* is immediately reflected at emitter 2*e* and hence at the output terminal 12. This potential as it appears at terminal 12 closely approximates ground potential. It may therefore be seen that the swing of the output signal from its Off (more negative) value to its On (more positive) value is dynamically driven by the inverter transistor 1. Furthermore, the swing of the signal potential at output terminal 12 is almost 100% of the load supply potential (battery 14).

When the input signal at terminals 3 and 4 returns to its On value, the inverter transistor 1 is cut off by the biasing battery 7 and the emitter-follower transistor 2 is rapidly switched On by the high potential applied to it by the load supply battery 9. It may therefore be seen that the switching of the output signal from its On (more positive) condition to its Off (more negative) condition is also dynamically driven, in this case by the emitter-follower transistor 2.

The inverter transistor 1 operates in response to an input signal of minimum current characteristics. The inverter circuit per se is not part of the present invention, but is shown in the copending application of George D. Bruce and Robert A. Henle, Serial 459,322, filed September 30, 1954, now U.S. Patent No. 2,891,172, issued June 16, 1959. The emitter-follower transistor produces output signals of substantial current. The emitter follower circuit per se is not part of the present invention, but is shown more completely in the copending application of George D. Bruce, Robert A. Henle and James L. Walsh, Serial No. 459,-382, filed September 30, 1954, now U.S. Patent No. 2,888,578, issued May 26, 1959.

FIG. 2

This figure illustrates a trigger circuit having complementary inputs and outputs, and consisting of two cross-coupled units, each unit comprising an inverter stage coupled to an emitter-follower stage as described above in connection with FIG. 1. The circuit comprises two inverter transistors 15 and 16, respectively driving emitter follower transistors 17 and 18. Each transistor has an emitter electrode identified by the reference numeral of the transistor followed by the letter *e*, a collector electrode similarly identified by the letter *c*, and a base electrode identified by the letter *b*.

Emitter electrodes 15*e* and 16*e* are connected directly to ground. Collector electrode 15*c* is connected directly through a wire 19 to base electrode 17*b*. Similarly, the collector electrode 16*c* is connected through a wire 20 to base electrode 18*b*. Collector electrode 15*c* is also connected through a resistor 21 and a battery 22 to ground. Collector electrode 16*c* is connected through a resistor 23 and the battery 22 to ground. The collector electrodes 17*c* and 18*c* are connected through a battery 24 to ground. Emitter 17*e* is connected through load resistor 25 and a battery 26 to ground. Similarly, emitter 18*e* is connected through load resistor 27 and battery 26 to ground. Battery 26 is connected through a resistor 28 to base 15*b*, and is also connected through a resistor 29 to base 16*b*. Base 15*b* is cross-coupled through a resistor 30 and parallel capacitor 31 to the emitter 18*e*. Similarly, base 16*b* is cross-coupled through a resistor 32 and a parallel capacitor 33 to emitter 17*e*.

Input signals may be supplied to base 15*b* through an input terminal 34, hereinafter referred to as the On input terminal. Terminal 34 is coupled to the base 15*b* through a Harper gate comprising a capacitor 35 and a diode 36 connected in series. The gate is opened or closed by a gating potential supplied through a terminal 37 and connected through a resistor 38 to the common terminal of the capacitor 35 and diode 36. That common terminal is also connected through a resistor 39 to an output terminal 40 and emitter 17*e*.

Input signals may alternatively be transmitted to the base 16*b* through an input terminal 41, hereinafter referred to as the Off input terminal, where is coupled to the base 16 through a Harper gate comprising the capacitor 42 and a diode 43 connected in series. The gate is opened or closed by a gating potential applied through a terminal 44 and a resistor 45 to the common terminal of capacitor 42 and diode 43. That common terminal is also connected through a resistor 46 to an output terminal 47 and to the emitter 18*e*.

Figure 2:
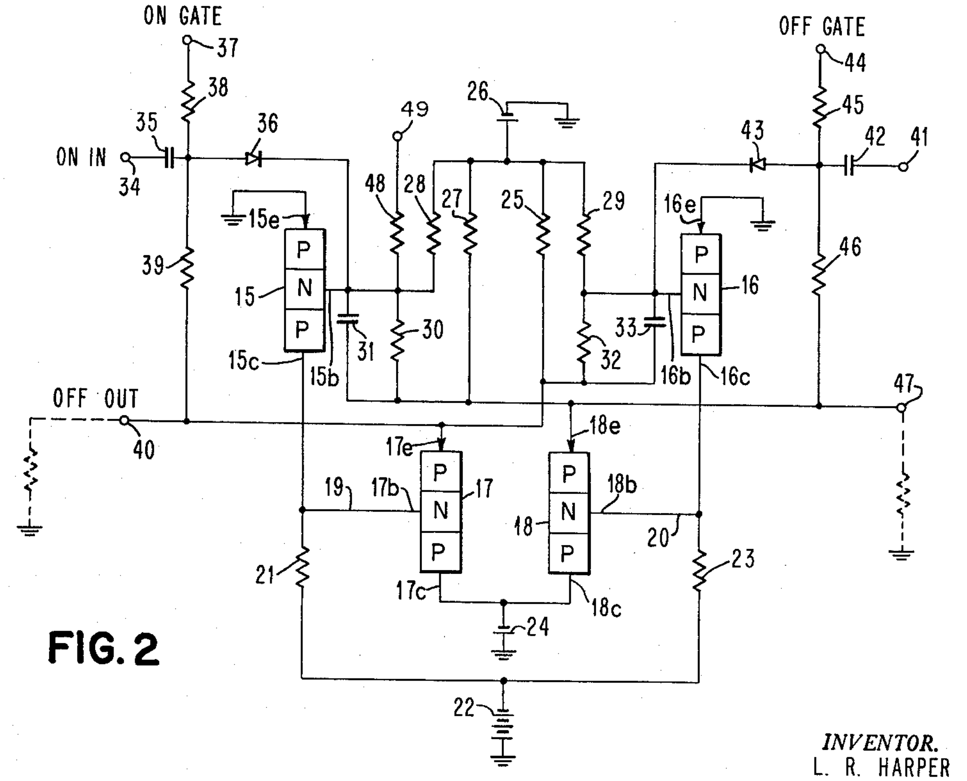
FIG. 2 is a wiring diagram of a trigger circuit employing two of the emitter-follower inverter stages of FIG 1.

*Operation of FIG. 2*

In the operation of this trigger circuit, one or the other of the emitter-follower transistors 17 and 18 is On and the other is Off. The inverter driving the particular emitter follower which is On is itself Off, and the inverter which is driving the Off emitter follower is itself On. If the transistor 17, for example, is On, then its inverter 15 is Off. The circuit may be switched from that stable condition to the opposite stable condition in which transistor 18 is On and transistor 17 is Off by supplying a proper input potential at the input terminal 34. That input signal can pass through the gate to the base 15*b* only if both the gating potentials supplied to the gate are such as to keep the gate open. One of those gating potentials is supplied from emitter 17*e* through resistor 39, so that a switch input signal may pass through the gate only if the trigger is in proper condition to be switched by that signal. In other words, the input signal is always of a polarity such as to switch transistor 17 from its On to its Off condition. Such a signal can pass through the gate only if the transistor 17 is On. The auxiliary gating terminal 37 may be connected to any other source of gating potential which it is desired to use. Alternatively, it may be omitted. However, the circuit is designed for use in a computer system wherein the logical circuits and other functional elements drive only gates, and hence have low current loads, whereas the input currents are supplied by driver circuits such as those disclosed in my copending application Serial No. 706,524, filed December 31, 1957, now United States Patent No. 2,937,291, issued May 17, 1960. The driver circuits are operated at timed intervals, and are not concerned with the logical functions. The logical circuits operate just ahead of the driver circuits, so that the driver circuits do the switching.

In a similar manner, when the transistor 18 is On, it can be switched Off by a signal potential applied through terminal 41. The function of the gate between terminal 41 and base 16*b* is analogous to the function of the gate between terminal 34 and base 15*b*.

When transistor 17 switches from its On to its Off condition, a signal is transmitted through the cross-coupling resistor 32 and capacitor 33 to base 16*b*. Inverter transistor 16 responds to that signal and drives the transistor 18 to its opposite condition. Similarly, cross-coupling signals are transmitted from emitter 18*e* through resistor 30 and capacitor 31 to base 15*b*. The output terminals 40 and 47 produce complementary signals, i.e., one terminal is at its Off potential when the other is at its On potential, and vice versa. This circuit is not an Eccles-Jordan type of trigger. These cross-coupling networks do not require the large storage capacities used in Eccles-Jordan types of triggers. The only purpose of capacitors 31 and 33 is to compensate for the input capacity of the transistors themselves.

These capacitors 31 and 33 have capacitance values substantially lower than the input capacitors 35 and 42. The time constant of the input coupling circuit is substantially greater than the sum of the two cross-coupling network time constants, so that the input signal (or a portion of it) still persists after the trigger has been switched. Because of this relation, the input gates are required to prevent the persisting input signal from retripping the trigger.

The input terminals 34 and 41 may be connected together to provide a binary count of the input signals.

A reset terminal 49 is connected through a resistor 48 to base 15*b*. This terminal is supplied with an input signal whenever it is desired to establish the trigger in a particular one of its two stable conditions.

A trigger circuit such as that described may be combined with other trigger stages to form a counter, a shifting register, or any similar circuit configuration in which such triggers are conveniently employed.

FIG. 3

This figure illustrates an alternative input gating arrangement which may be used with the trigger of FIG. 2. This input gate differs from that of FIG. 2 in that resistor 39 is connected to a second gate input terminal 37*a*, instead of being connected to the output terminal 40. It should be understood that the other side of the trigger has a similar input gate.

This circuit, like that of FIG. 2, may have its input terminals connected together to provide a binary count of input signals. However, if so connected, the two gate terminals 37*a* must be connected to inputs of opposite polarities, i.e., if one is at a potential representing A, the other must be at a potential representing "not A."

Consequently, this gate is controlled by two external conditions, rather than by one external condition and the potential at emitter 17*e*.

FIG. 4

This figure illustrates a trigger circuit including a single output transistor 51, connected as an emitter follower and driven by two input transistors 52 and 53, each connected as an inverter.

Each of the transistors 51, 52 and 53 has an emitter electrode indicated by the reference numeral of the transistor followed by the letter *e*, a base electrode indicated by the same reference numeral followed by the letter *b* and a collector electrode indicated by that reference numeral followed by the letter *c*.

The emitter electrodes 52*e* and 53*e* are directly connected to ground. Collector electrode 52*c* is connected through a resistor 54 to collector 51*c*. Collector 51*c* is connected to ground through a battery 55. Collector 53*c* is connected through a resistor 56 and a battery 57 to ground. Collector 53*c* is connected directly to base electrode 51*b* through a wire 58.

Transistor 53, connected as an inverter, drives the transistor 51 in the same manner that inverter transistor 1 drives the emitter follower transistor 2 of FIG. 1.

Emitter 51*e* is cross-coupled through the resistor 59 and a parallel capacitor 60 to base 52*b*. Collector 52*c* is similarly cross-coupled through resistor 61 and a parallel capacitor 62 to base 53*b*. A battery 63 supplies biasing potential through a resistor 64 to base 52*b* and through a resistor 65 to base 53*b*. Emitter 51*e* is also connected through a resistor 67 to battery 63.

Binary input signals are supplied to input terminals 68 and 69. Input terminal 69 is connected to ground. Input terminal 68 is connected through a gate comprising a capacitor 70 and a diode 71 to base 52*b*. Input terminal 68 is also connected through a gate comprising a capacitor 72 and a diode 73 to base 53*b*. The common terminal of capacitor 70 and diode 71 is connected through a resistor 74 to collector 52*c*. The common terminal of capacitor 72 and diode 73 is connected through a resistor 75 to emitter 51*e* and to an output terminal 76. The common terminal of capacitor 72 and diode 73 is also connected through the resistor 77 to ground. The common terminal of capacitor 70 and diode 71 is connected through a resistor 78 to a gate input terminal 79, which is connected through a resistor 81 to the negative terminal of battery 57.

Figure 4:
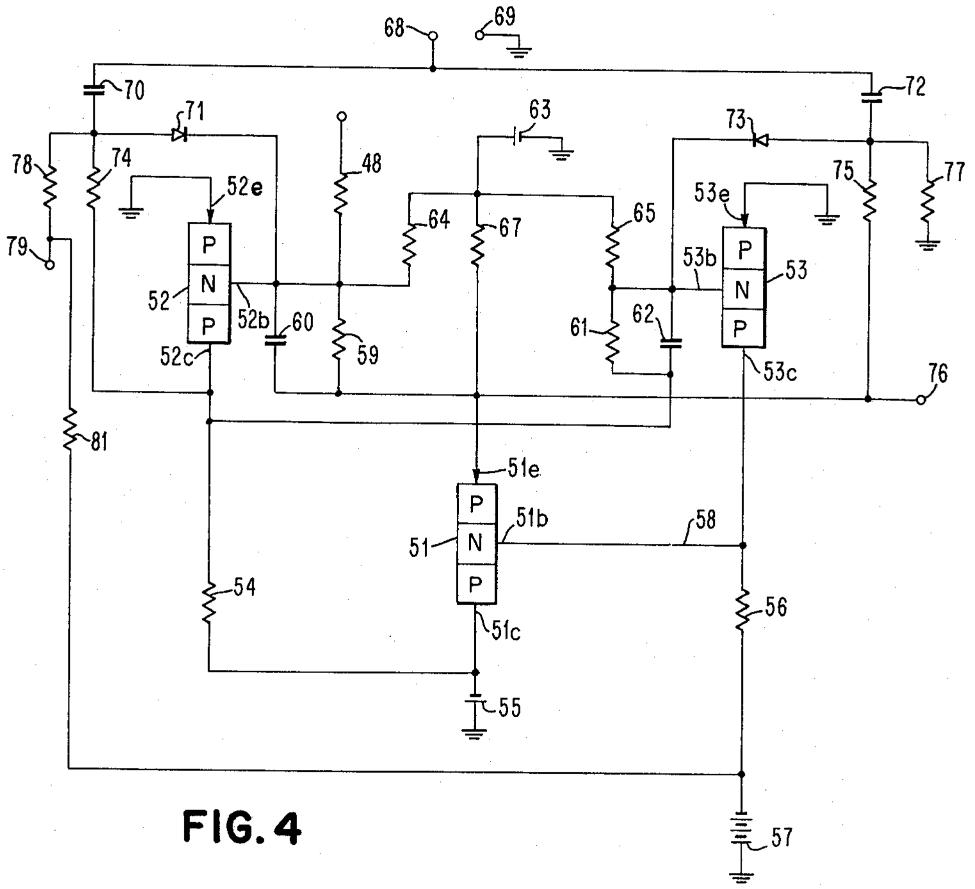
FIG. 4 is a wiring diagram of a modified form of trigger circuit embodying the invention.
Figure 3:
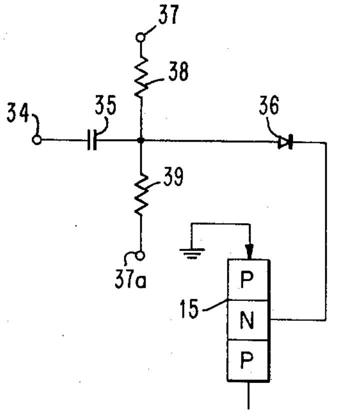
FIG. 3 is a wiring diagram of a modified form of input gate for use with the circuit of FIG. 2.

*Operation of FIG. 4*

When transistors 51 and 52 are On, transistor 53 is Off. The gate at the input of transistor 52 is open so that a binary input signal appearing at the terminals 68 and 69 is effective to switch the transistor 52 Off. When transistor 52 switches Off, a signal is transmitted through the cross-coupling resistor 61 and capacitor 62 to transistor 53, switching that transistor On. Transistor 53 switching On switches transistor 51 Off.

When the next binary input signal is received at terminals 68 and 69 the gate at the input of transistor 52 is closed, but the gate at the input of transistor 53 is open. Therefore, the signal is transmitted to transistor 53, which switches Off and transmits through transistor 51 and cross-coupling resistor 60 and capacitor 59 an inverted signal to transistor 52 effective to switch that transistor On. The gate at the input of transistor 52 may be externally controlled by a signal applied at the terminal 79.

The following table gives values of resistors and capacitors and battery potentials which have been used in circuits constructed in accordance with the invention and operated successfully. It should be understood, however, that the invention is not limited to these particular values, or any of them.

FIG. 1

| | | |
|---|---|---|
| Capacitor 5 | pfd | 330 |
| Resistor 6 | ohms | 11K |
| Resistor 6a | do | 15K |
| Battery 7 | volts | 3 |
| Resistor 8 | ohms | 22K |
| Battery 9 | volts | 51 |
| Resistor 11 | ohms | 1.5K |
| Battery 14 | volts | 6 |

FIG. 2

| | | |
|---|---|---|
| Resistor 21 | ohms | 22K |
| Battery 22 | volts | 51 |
| Resistor 23 | ohms | 22K |
| Battery 24 | volts | 6 |
| Resistor 25 | ohms | 1.5K |
| Battery 26 | volts | 3 |
| Resistor 27 | ohms | 1.5K |

FIG. 3

| | |
|---|---|
| Resistor 28 | 15K ohms or 16K ohms. |
| Resistor 29 | 15K ohms or 16K ohms. |
| Resistor 30 | 11K ohms or 10K ohms. |
| Capacitor 31 | 330 pfd. |
| Resistor 32 | 11K ohms or 10K ohms. |
| Capacitor 33 | 330 pfd. |
| Capacitor 35 | 560 pfd. |
| Diode 36 | Philips type OA–85, Hughes type 191 or equivalent. |
| Resistor 38 | 10K ohms. |
| Resistor 39 | 15K ohms. |
| Capacitor 42 | 560 pfd. |
| Diode 43 | Philips type OA–85, Hughes type 191, or equivalent. |
| Resistor 45 | 10K ohms. |
| Resistor 46 | 15K ohms. |
| Resistor 48 | 10K ohms. |

FIG. 4

Same values as for corresponding elements of FIG. 2, except the following:

| | | |
|---|---|---|
| Resistor 54 | ohms | 1K |
| Resistor 59 | do | 10K |
| Resistor 64 | do | 16K |
| Resistor 81 | do | 160K |

While I have shown and described certain preferred embodiments of my invention other modifications thereof will readily occur to those skilled in the art, and I therefore intend my invention to be limited only by the appended claims.

I claim:

1. A transistor switching circuit comprising a first transistor having an emitter electrode, a base electrode, and a collector electrode, means connecting said emitter electrode to a common junction, means reversely biasing the base-emitter impedance of the transistor and tending to hold it in a relatively low conduction state, input means for supplying to the base electrode a square wave signal potential of polarity and magnitude sufficient to overcome said reversely biasing means and switch the transistor to a relatively high condition state, a first load resistor and a first source of unidirectional electrical energy connected in series between said collector electrode and said common junction, said transistor being effective to produce at its collector electrode an output signal whose polarity is inverted with respect to its input signal, a second transistor having an emitter electrode, a base electrode, and a collector electrode, means directly connecting the base electrode of said second transistor to the collector electrode of the first transistor so that the output signal of the first transistor tends to switch the second transistor between relatively high and low conduction states when the first transistor switches between relatively low and high conduction states, a second load resistor and a second source of unidirectional electrical energy connected in series between the emitter electrode of the second transistor and said common junction, said first and second sources and said first and second load resistors being connected in a series loop with the emitter-base impedance of the second transistor, said first and second sources both being poled to bias forwardly the emitter-base impedance of said second transistor, said sources and load resistors being proportioned so that when said second transistor is in its high conduction state, there is transmitted through said last mentioned impedance a current greater than the minimum base saturation current of said second transistor and effective to store minority carriers in said second transistor, said current being effective to supply a substantial external load connected to the emitter electrode of the second transistor, said stored minority carriers being effective when said first transistor switches on to its relatively high conduction state to provide a low impedance path through the base-emitter impedance of said second transistor, whereby the second transistor is rapidly switched to its low conduction state and the emitter electrode thereof is rapidly switched to its off potential.

2. A transistor circuit as defined in claim 1, comprising means including the second transistor, to limit the swing of the potential of the collector of the first transistor when said second transistor is in its high current conduction state.

3. A transistor circuit as defined in claim 2, wherein said potential swing limiting means comprises third source of unidirectional electrical energy connected to the collector of the second transistor, and wherein said first, second and third sources have their potentials related so as to bias forwardly the emitter-base impedance of the second transistor and to apply a different forward bias potential to the emitter-collector impedance of the second transistor, so that the third source connected to the collector of the second transistor serves as a limit to the swing of the potential of the base of the second transistor, and thereby of the collector of the first transistor.

4. A transistor switching circuit as defined in claim 1, including a third transistor having emitter, base, and collector electrodes, means connecting the emitter electrode of the third transistor to said common junction, means reversely biasing the base-emitter impedance of the third transistor and tending to hold it in a relatively low conduction state, first cross-coupling means connecting the emitter electrode of the second transistor to the base electrode of the third transistor and effecive when the second transistor is in its high conduction state to supply to the base electrode of the third transistor a potential effective to overcome said last-mentioned reversely biasing means and maintain the third transistor in a relatively high conduction state, a third load resistor connected between the collector electrode of the third transistor and the common terminal of said first resistor and said first source, said third transistor being effective to produce at its collector electrode a signal whose polarity is inverted with respect to the signal at its base electrode, a fourth transistor having emitter, base and collector electrodes, means directly connecting the base electrode of the fourth transistor to the collector electrode of the third transistor so that the signal at the collector of the third transistor tends to switch the fourth transistor between relatively high and low conduction states when the third transistor switches between relatively low and high conduction states, a fourth load resistor connected between the emitter electrode of the fourth transistor and the common terminal of the second load resistor and the second source, said first and second sources and said third and fourth load resistors being connected in a series loop with the emitter-base impedance of the fourth transistor, said first and second sources both being poled to bias forwardly the emitter-base impedance of said fourth transistor, said sources being proportioned with respect to the third and fourth load resistors so that when said fourth transistor is in its high conduction state there is transmitted through said last-mentioned impedance a current greater than the minimum base saturation current of said fourth transistor and effective to store minority carriers in said fourth transistor, said current being effective to supply a substantial external load connected to the emitter electrode of the fourth transistor, said stored minority carriers being effective when said first transistor switches to its relatively high conduction state to provide a low impedance path through the base-emitter impedance of said fourth transistor, whereby the fourth transistor is rapidly switched to its low conduction state and the emitter electrode thereof is rapidly switched to its OFF potential, and second cross-coupling means connecting the emitter electrode of the fourth transistor to the base electrode of the first transistor and effective when the fourth transistor is in its high conduction state to supply to the base electrode of the first transistor a potential effective to maintain the first transistor in a relatively high conduction state.

5. A transistor switching circuit as defined in claim 1, including a third transistor having emitter, base, and collector electrodes, means connecting the emitter electrode of the third transistor to said common junction, means reversely biasing the base-emitter impedance of the third transistor and tending to hold it in a relatively low conduction state, first cross-coupling means connecting the emitter electrode of the second transistor to the base electrode of the third transistor and effective when the second transistor is in its high conduction state to supply to the base electrode of the third transistor a potential effective to overcome said last-mentioned reversely biasing means and maintain the third transistor in a relatively high conduction state, a third load resistor connected between the collector electrode of the third transistor and the collector electrode of the second transistor, a third source connected between the collector electrode of the second transistor and said common junction, and second cross-coupling means connecting the collector electrode of the third transistor to the base electrode of the first transistor.

References Cited in the file of this patent

UNITED STATES PATENTS

| | | |
|---|---|---|
| Re. 23,770 | Bergfors | Jan. 12, 1954 |
| 2,545,924 | Johnstone | Mar. 20, 1951 |
| 2,719,228 | Auerbach et al. | Sept. 27, 1955 |
| 2,828,450 | Pinkaers | Mar. 25, 1958 |
| 2,887,542 | Blair et al. | May 19, 1959 |

OTHER REFERENCES

Turner: Transistor, Gernsback Library, Inc., ©, 1954, pp. 83–86.

Pub. (1): Electronic and Radio Engineer, "Transistor Bias Stabilization," pp. 161–165, May 1957.

Pub. (2): Electronics Buyers Guide, "Transistor Flip-Flops," pp. R–24, R–25, June 1957.